United States Patent
Rihtniemi et al.

(10) Patent No.: US 7,302,368 B2
(45) Date of Patent: Nov. 27, 2007

(54) METHOD AND ARRANGEMENT FOR FORMING CONSTRUCTION

(75) Inventors: Timo Rihtniemi, Helsinki (FI); Pertti Alho, Helsinki (FI)

(73) Assignee: Tekla Corporation, Espoo (FI)

(*) Notice: Subject to any disclaimer, the term of this patent is extended or adjusted under 35 U.S.C. 154(b) by 607 days.

(21) Appl. No.: 10/368,449

(22) Filed: Feb. 20, 2003

(65) Prior Publication Data

US 2004/0098235 A1 May 20, 2004

(30) Foreign Application Priority Data

Nov. 19, 2002 (FI) .................................. 20022061

(51) Int. Cl.
*G06F 17/50* (2006.01)

(52) U.S. Cl. ...................................................... 703/1

(58) Field of Classification Search ..................... 703/1
See application file for complete search history.

(56) References Cited

U.S. PATENT DOCUMENTS

| | | | |
|---|---|---|---|
| 4,858,146 A | 8/1989 | Shebini | |
| 5,841,040 A | 11/1998 | Walls | |
| 6,081,654 A | 6/2000 | Morman et al. | |
| 6,116,180 A | 9/2000 | Thompson | |
| 6,125,333 A * | 9/2000 | Pun | 702/42 |
| 6,272,447 B1 | 8/2001 | Gavin et al. | |
| 6,434,492 B1 | 8/2002 | Pollack et al. | |
| 6,799,463 B2 * | 10/2004 | Fields et al. | 73/577 |
| 6,901,809 B2 * | 6/2005 | Dong et al. | 73/789 |

* cited by examiner

*Primary Examiner*—Hugh Jones
(74) *Attorney, Agent, or Firm*—Young & Thompson

(57) ABSTRACT

This invention relates to the forming of a construction, where structural models representing structural members and the models of the loads describing real loads are used. The models of the loads are situated in the same space with the structural models of the construction. For each model of load, an influence space is defined. The effect of the model of the load is focused on the structural members at least partly inside the influence space of the model of the load.

35 Claims, 5 Drawing Sheets

METHOD AND ARRANGEMENT FOR FORMING CONSTRUCTION

FIELD OF THE INVENTION

This invention relates to the forming of a construction. The construction comprises structural members. Further, the invention relates to structural models of the structural members. Especially, the invention relates to the loads that affect on the construction.

BACKGROUND OF THE INVENTION

When forming a building (or a bridge), a supporting construction must be formed for carrying all internal and external loads influencing the building. Different load types exist as FIG. 1 illustrates: point load, line load, and area load. The figure shows only the basic types but other types exist, for example moments, which are normally used. In area A, the point load focuses on point 1. Area B shows that the load forms a line load focusing on line 2. Correspondingly, Area C shows how the load is distributed in area 3. The length of the load lines illustrates the power of the loads.

Traditionally, the loads are shared among the structural members of the supporting construction. Calculations are made so that each structural member carries the load focused on it. FIG. 2 shows an example of a construction 24 on which some loads affect. The construction (more precisely the supporting construction) is composed of structural members, such as beams and columns. The vertical lines 21 illustrate the weight on the construction, i.e. vertical load, which can be, for example, snow and/or other loads. Since the upper beams 23 of the construction are the first structural members to carry the vertical load 21, the load is shared to the upper beams. Further, since the beams are long objects, they are preferably thought of as lines on which the load 21 affects—due to this the load acts as a line load.

Thinking more precisely about the vertical load 21 and it's distribution to the upper beams 23, it should be noted that the vertical load forms (in this case) an area load, but is focused on several line loads, each of which is carried by a certain upper beam. Further, it is also possible to divide the line loads into several point loads.

So, each upper beam carries a certain line load—the beam and the line load are connected to each other. The division calculations are utilized. Calculations are needed for ensuring that the structural members are capable of carrying the loads focusing on the construction. Before a connection, the capacity of a structural member to carry a load is calculated. Single structural member may carry several loads, i.e. several connections must be made. Naturally, a structural member may perform a load for another structural member. For example, the upper beams 23 perform loads to columns 25 in FIG. 2. So, the structural members may also perform a chain of loads, which is carried by one or more structural members. Without the calculations it is impossible to form a reliable construction.

If a number of beams or their position, for example, change for some reason, in FIG. 2, the division calculation of the load to smaller load entities is made. The load entities are connected to again to the structures. After that the distribution of the loads in the construction must be calculated. It is recalculated that the new construction can carry the loads. Due to all these, reconnections between the changed structure and loads are very tedious to make.

FIG. 2 also illustrates an example of a horizontal load (horizontal lines), forming a line load that is divided into point loads 22. The horizontal load may, for example, be a wind load. The columns 25 and 26 carry the load. This horizontal load is not distributed uniformly, but in the upper part of column 25, the point loads 22A are greater than in the rest of the columns. As can be noted, a construction may carry different types of loads receiving their forces and moments.

There are a number of applications utilizing different software for forming a model of a construction. The applications use structural models that correspond to real physical structural members, such as beams, columns, slabs etc. It is common that an application applies to a certain task, or tasks, and another application to another task.

A physical model, i.e. the model that is composed of structural members, and an analysis model, i.e. the model that calculates the strength of the members to carry the loads, are divided into separate applications. The loads are given in the analysis model and they are point or line loads. If an area load is desired, it must be divided into line and/or point loads before-hand. The physical model is used to make the analysis model from the structural members of the physical model. The structural members are presented in the analysis model with nodes and beams, which are simpler models of the structural members.

It is that applications do not cooperate more than that. Also the division of area loads to smaller entities, such as to line and point loads, is made for the analysis model by hand or by special application. The connections between loads and structural members are also made by hand. There might be some automation in making connection. But the way of handling the loads is static, tedious and means frustrating work when construction changes.

So, the problem of known solutions is that, when changing structural members, the division of the loads must be made again since the loads are in direct connections, through the calculations, with the structural members. The aim of this invention is to alleviate this drawback. This is achieved in a way described in the claims.

SUMMARY OF THE INVENTION

The invention is based on an idea to form the models of loads describing real loads and use them in a similar way as structural models that correspond to real physical structural members. The models of the loads are situated into the space where the structural models of the construction are or are going to be situated. For each model of load, an influence space is defined. Those structural models, which are totally or partly inside the influence space, may be selected to be structural members for carrying the load. In other words, an effect of the model of the load is focused on the structural members inside the influence space of the model of the load, through which the model of the load affects in the construction.

In this context, the next definitions should be kept in mind: a load means a real load; a model of a load means a model from a single real load; and the loadmodel means a system that contains all the models of the loads of a construction. However, in some context 'the load' has been used for referring to 'a model of load' depending on the context.

The focusing action means that connections and load division calculations are made between the load and the structural member (naturally, using the model of the load and the structural member). Since the models of the loads are in the same space where the structural models affect or are going to affect, they are reusable in a very convenient way. When, for example, the number of structural models of the construction is changed to another number, the load-model can be used for the new situation. In know solutions, load division calculations and the inserting of the loads divided must be made again, since they have direct connections between the loads and the structural members. According to the invention, models of loads exist among structural models, despite that the construction may have been changed. The focusing action between the loads and members can be made automatically.

BRIEF DESCRIPTION OF THE DRAWINGS

In the following the invention is described in more detail by means of FIGS. 1-11 in the attached drawings where.

DESCRIPTION OF THE INVENTION

Figure 1:
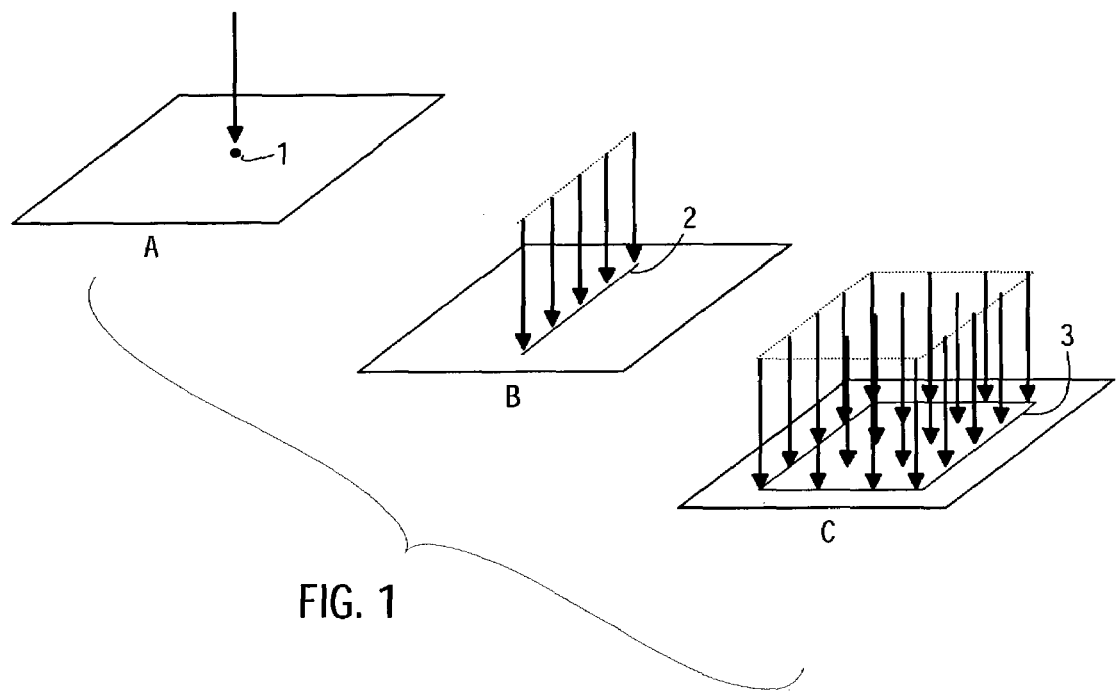
FIG. 1 illustrates different load types.
Figure 2:
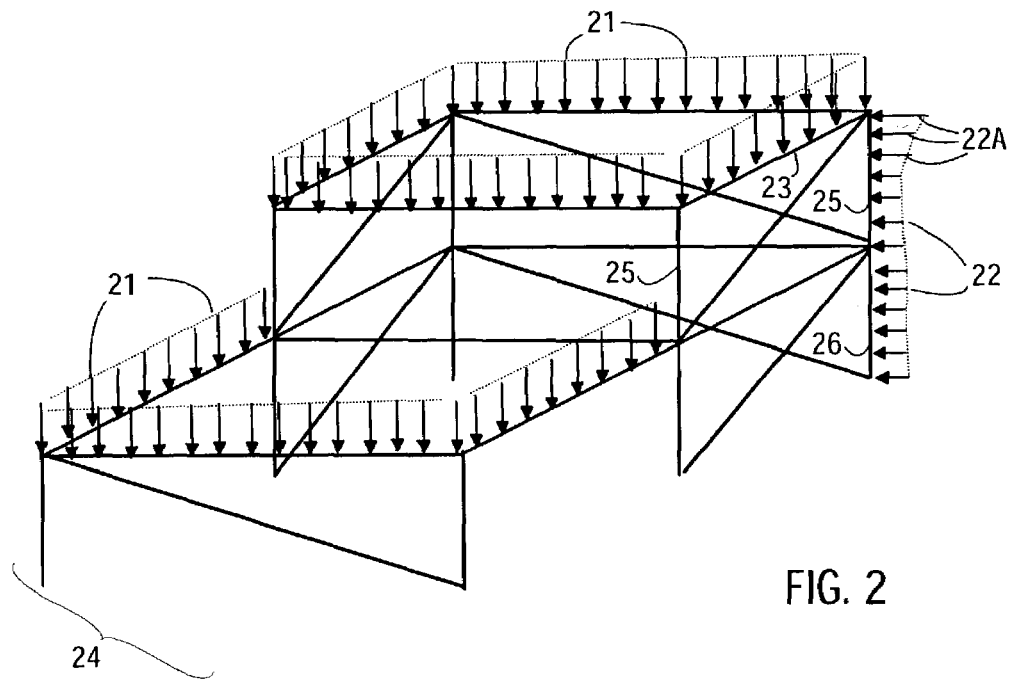
FIG. 2 illustrates an example of a construction on which some loads affect.
Figure 3:
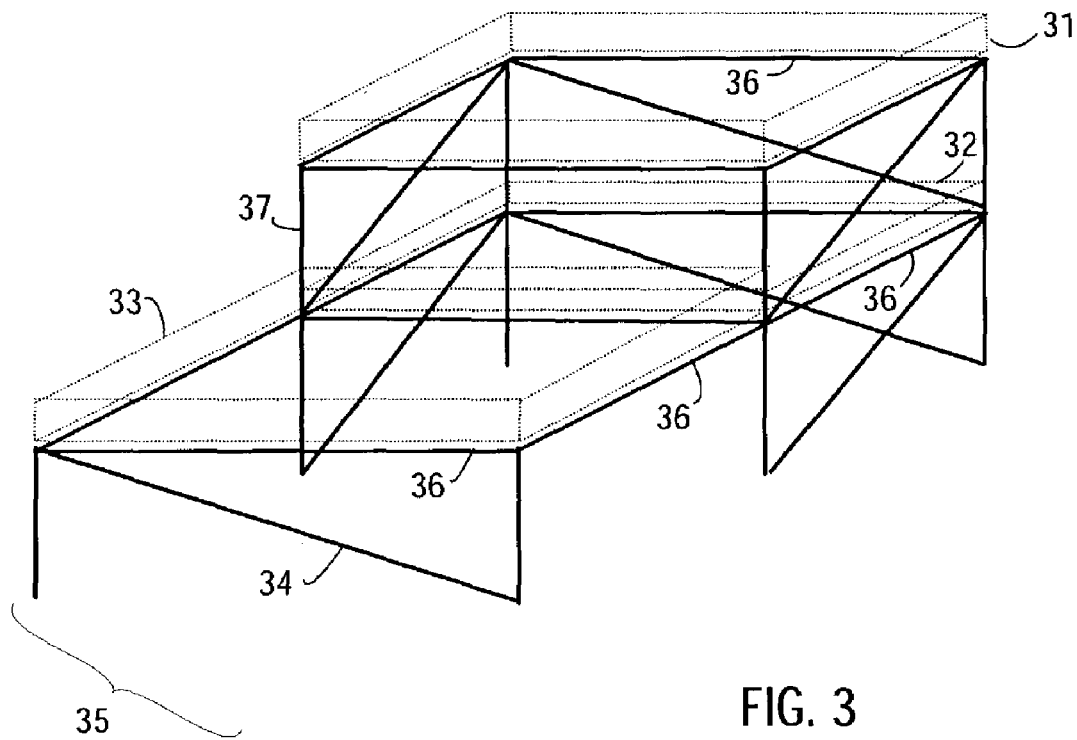
FIG. 3 illustrates an example of the models of the loads in the same space with structural models of a construction.
Figure 4:
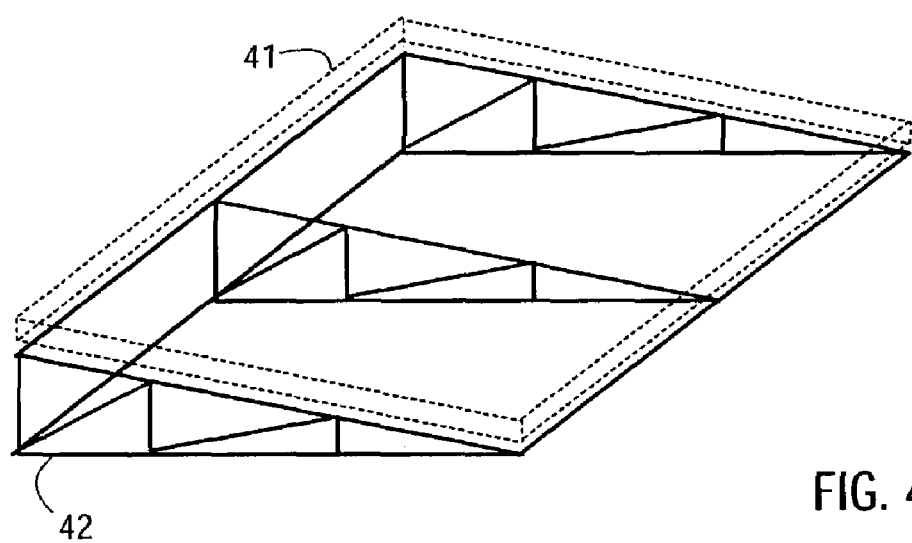
FIG. 4 illustrates another example of the models of the loads in the same space with structural models of a construction.

FIG. 3 shows an example where loads models 31, 32, and 33 are situated into the same space with structural models 34 of a construction 35 according to the invention. All the models of the loads, marked in dashed lines, illustrate area loads on some level of the construction, loads 31 and 33 on the roof of the construction and load 33 on an intermediate floor of the construction. The direction, in which these loads affect, is down and the construction has to be capable to carry them. The beams 36 just below each load are the structural models whereto the effect of the load is first focused. The columns 37 carry the beams and the loads in turn. FIG. 4 shows another example, where a model of a load 41 represents a load on the roof construction 42, which has to be capable of carrying the load.

In both the examples of FIGS. 3 and 4, it can be noted that the models of the loads are situated in the same space where the structural models are or are going to be, to places where real loads exist, and the models of the loads have a certain direction or directions where the loads affect—in these cases the direction is down due to gravity. But, how is it possible to connect the models of the loads to structural models, and how to select structural models that actually carry the loads for calculating the capability of the construction to carry the loads?

Figure 5:
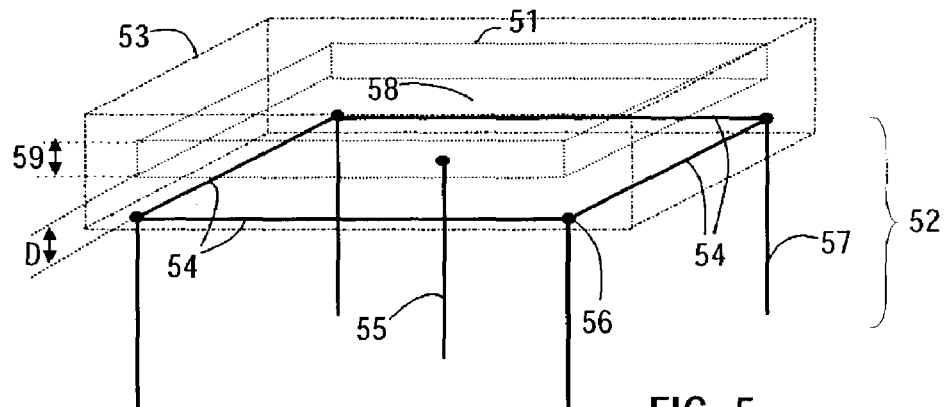
FIG. 5 illustrates an example of how to focus the effect of a model of the load on structural models.

FIG. 5 shows an example of how to focus the effect of the model of a load 51 on a construction 52. A preferable way is that the load is focused on the nearest structural members around the load. This is possible by defining an influence space of the load. The effect of the load is preferably on the bottom level 58 of the model of the load 51, and the height 59 of the model represents the volume of the load. It should be noted that the effect level may be a point in a point load case or a line in a line load case. Let the influence space be a square 53, which surrounds the bottom 58 of the model of the load 51, and let the distance from the bottom to the edge of the influence space, be D. At least a part of each structural model is inside the influence space. If only the influence space is used as a criterion to select structural models whereon the load is focused, strength calculations may become very unrealistic. Additional requirements to be used as selecting criteria may preferably be needed.

When examining FIG. 5, it can be noted that the beams 54 and one column 55 are the primary structural members to carry the load. Due to this it is convenient to focus the load on these members (using the models). The model of the load is decomposed into elementary loads, which are connected to the nearest structural model, i.e. to one of the beams or to the column. In the connections, the effect point, or points, of the elementary load on the structural model, or models, is at the point, or points, where the influence of the elementary load meets the structural model or models. Since the model of the load represents a load, such as snow, on the construction, the natural direction for the effect of each elementary load is down towards the nearest structural model. The strength calculations are possible to make utilizing these connections.

FIG. 5 also shows nodes 56. They are models for connection members between different elements, such as different beams, beams and columns, etc. They may or may not be selected to carry the load. In this case, as described above, the load is focused on the beams and one column. For separating the nodes and the rest of the columns from the members carrying the loads, some criteria are needed. Names of the structural models can be used as such criteria. This requires that the naming system of the structural model be well organized. For example, beams may be named as Beam-TYPE.*, columns as Column-TYPE.*, and nodes as Node-TYPE.*. If the type of used beams in FIG. 5 is 101, the type of the columns at the corner 555, and the type of the middle column 222, the beams Beam-101.* and the column Column-222.* may be filtered from the other structural members using the names of the members as selecting criteria. The corner columns are filtered out since their names do not belong to the allowed names, and at the same time to the allowed column types. The nodes are filtered out since they are not allowed to carry the load in this case, and thus allowed node types do not exist. Naturally, other criteria than names may be used as additional requirements—for defining the right members. For example, types of the structural models may be used as a criterion. The aspect of the additional requirements is to define carrying structural members for loads. Some congealed members are not designed to carry loads, and they must preferably be separated from the carrying members. Furthermore, the structure of the construction may be used when dividing the loads, irrespective of single members, so the relevant carrying members are deduced from the construction's structure.

Figure 6:
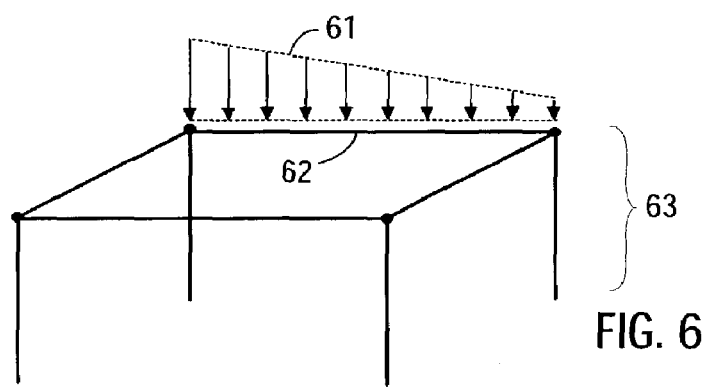
FIG. 6 illustrates an example of a line load that is carried by a beam of a construction.
Figure 7:
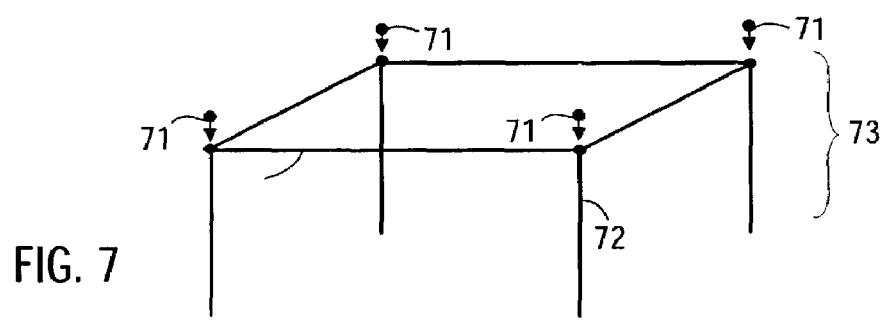
FIG. 7 illustrates an example of point loads above columns of a construction.

When the model of the load of FIG. 5 is decomposed into elementary models, the area load is divided into line loads— and if necessary to point loads. The line loads are convenient when beams or other long objects carry the load. The point loads are convenient when the tops of columns or other relatively restricted areas carry the load. FIG. 6 illustrates an example of a line load 61 that is carried by a beam 62 of a construction 63. As can be seen, in this example the line load is not uniform along the beam, but it changes linearly. FIG. 7 shows an example of point loads 71 above columns 72 of a construction 73. In this example the point loads may represent, for example, the upper floor structures, which are thought to be built later.

Figure 8:
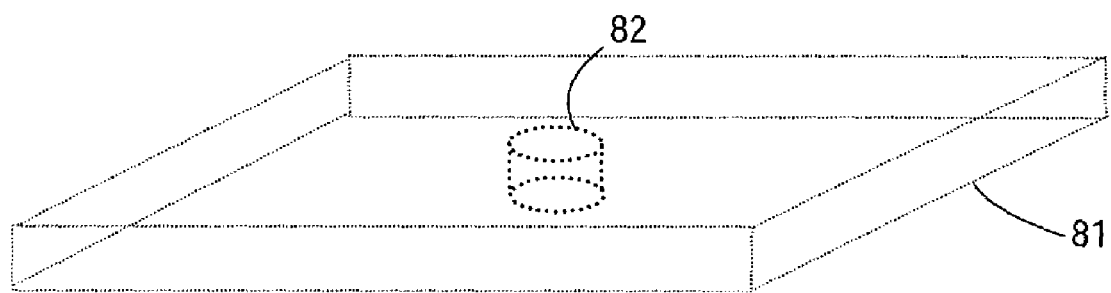
FIG. 8 illustrates an example of an area load, which is not uniform.
Figure 9:
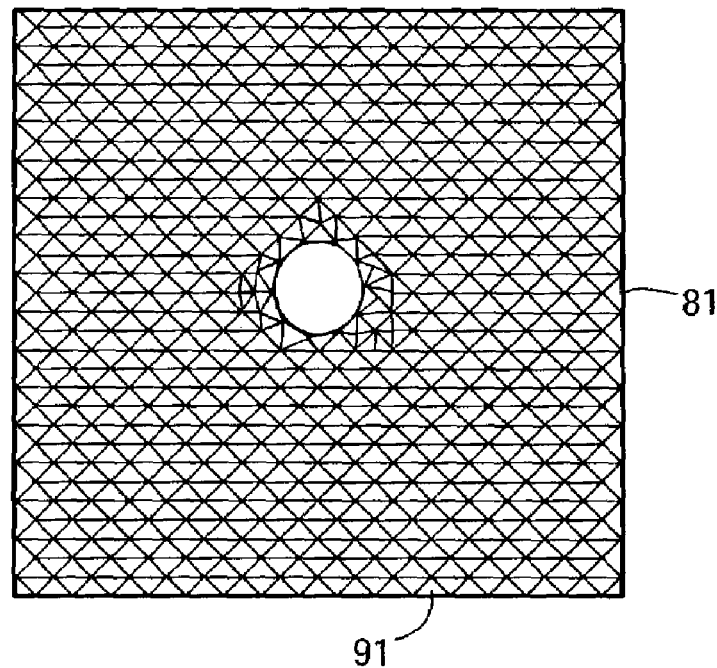
FIG. 9 illustrates the area load of FIG. 8 from above.

FIG. 8 shows an area load 81, which is not uniform, since there exists a circle shaped hole 82 in the middle of the load. The load is not affecting in this circle area. It is clear that area loads—and area models—may be different in sizes, different in shapes, and different in resultant. FIG. 9 shows the area load of FIG. 8 from above. As mentioned before, area loads are (usually) decomposed into smaller loads, called elementary loads, in order to focus the effect of the load on the construction that carries it. A decomposition method usually used is the division of the area load into triangles of suitable size, as described in FIG. 9. Each triangle 91 forms an elementary load. The resultant of the elementary load is thought to be at the center of the triangle. From this center point, the resultant of the elementary load is connected to the nearest structural member that carries the elementary load. The resultant of the elementary load, i.e. the effect of the elementary load, may be directed to one or more points on the structural member. Naturally the effect (influence) may be directed to more than one structural member. So, the point or points where the influence of the elementary load (effect) meets the structural model, or models, is affected by the force and/or moment of the elementary load. The point or points are preferably the nearest parts of the structural member from the elementary load. Naturally, it is possible to use other shapes of elementary load than triangles, such as polygons.

The direction of the effect of the model of the load is the direction in which the load's force or moment is physically directed. When dividing the model of the load into the elementary loads, the direction is defined as well. The effect is preferably focused on the nearest structural model.

Normally, the directions of the effect of the models of the loads are defined at the same time when they have been performed. In some cases, there may be more than one direction. For example, the model of the load, may illustrated a pressure load, i.e. a volume load, like water in a swimming pool, a water tower, a gas tank etc. Then the models of the load have five direction of the effect. Naturally, this kind of pressure load may be modeled using a combination of separate area loads—in the swimming pool example, five area loads for each side and the bottom of it.

A load may be due to temperature differences as well. It may create, for example, a direct force or a moment in a construction member. The load in question may also be a dynamic load, i.e. it changes with time, for example a wind load straining a pipe.

Figure 10:
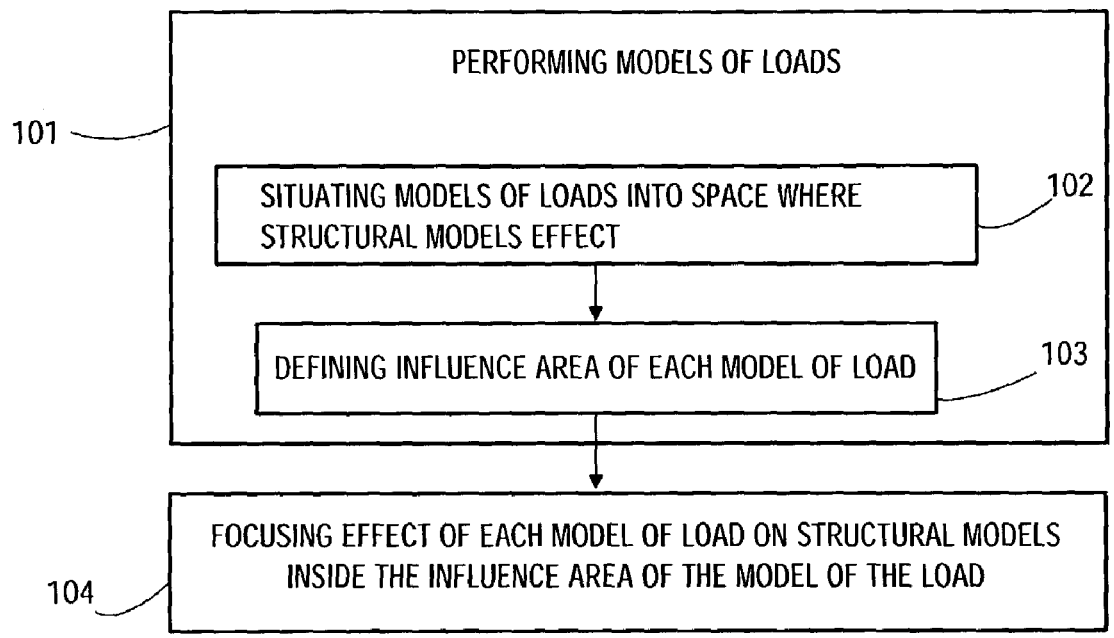
FIG. 10 illustrates an example of a flow chart describing an aspect of the inventive method.

FIG. 10 shows an example of a flow chart describing an aspect of the inventive method. First, the models of the loads are made in step 101. The forming of the models of the loads may be started from zero or if old models of the loads, or model standards, exist, they may be used as starting points for the formation. The formation step comprises two substeps, as can be seen from FIG. 10. The models of the loads are situated 102 in the space where the structural models of the construction exist or are going to be situated. The models of the loads are situated to places where they affect in the physical construction in desired positions. After the model of the load is situated in the space where the structural models affect or are going to affect, the influence space of the model of the load is defined 103. The influence space restricts the area in space wherein the load affects. When defining the influence space, the direction (or directions) of the load's affect (force, moment) may be taken into account. Next, the effect of each model of load is focused 104 on the structural models at least partly inside the influence space of the model of the load. When focusing the effect, each model of load is decomposed into elementary loads. Each elementary load is connected to the structural model that is meant to carry it. This is made in a way that the effect point, or points, of the elementary load on the structural model is at the point, or points, where the influence of the elementary load meets the structural model, or models. Utilizing these connections, it is calculated that each structural model is capable of carrying the elementary loads connected to it.

As can be noted, the order of forming the models of loads or structural models may be different in different solutions according to the invention.

There exist a number of applications to make the modeling. A normal way is to use different applications to make the model of a construction and to make analysis and designs. The construction and calculation applications work together in an inventive arrangement, since construction information is needed for analysis and designs. An application for modeling loads is needed, which may belong to the calculation application as a part. The division of the model of the load into elementary loads may utilize known FEM methods (Finite Element Method). However, an inventive arrangement may be formed using only one application instead of several applications.

Figure 11:
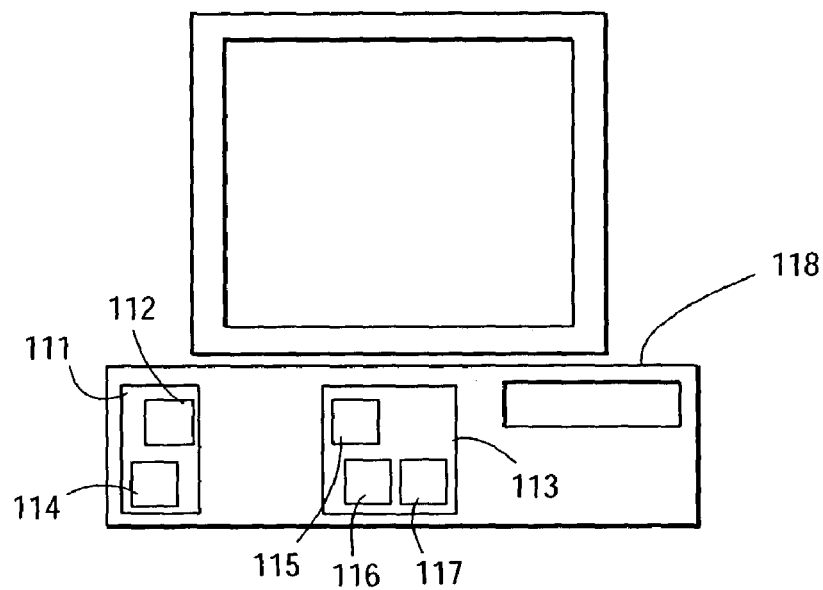
FIG. 11 illustrates an example of an arrangement according to the invention.

FIG. 11 illustrates an example of an arrangement according to the invention. A computer 118 is adapted to form a construction model utilizing the inventive modules. The inventive arrangement comprises a module for forming the models of the loads 111, which correspond to real loads that affect in the construction, a module for situating the models of the loads 112 in the same space with the structural models, and a module 113 for focusing the effect of each model of load on the structural models at least partly inside the influence space of the model of the load, through which the model of the load affects in the construction. As described before, additional requirements are used at the focusing step. If the additional requirements for the structural models are satisfied, the models are selected to be the structural members to which the load is focused. So, the focused models of the loads are used for forming the construction, which is capable of carrying the loads.

Further, the arrangement comprises a module 114 for defining an influence space of each model of load. Preferably the modules 114 are situated in or among the module for making the models of the loads 111, as are the situating modules too.

The focusing module 113 comprises a first module 115 for decomposing each load into elementary loads, a second module 116 for connecting each elementary load to the structural model that is meant to carry it, and a third module 117 for ensuring that each structural model is capable of carrying the elementary loads connected to it.

One preferable arrangement according to the invention is the integration of different applications into one entity. For example, the analysis model can be integrated into the physical model. This application, combined with the focusing action of the models of the loads in the space where the structural models are or are going to be situated, makes it possible to dynamically analyze and measure the structural members. The focusing and analyses are made just after the construction has been changed. Area loads, instead of point or line loads, also are possible to give, when it eases the work of the user.

The invention also concerns a computer program product, which is stored on a computer readable storage media. The product has been adapted to perform the steps of claim 1 and/or the other method claims when run on a computer.

Since the loads are possible to store in an inventive arrangement, the strength calculations (comprising the focusing of the resultants of the loads) are possible to make automatically. This is possible by using the models of the loads. The load data needs to be given to the inventive arrangement only once. The invention makes it possible to reduce the work and time of the user.

The invention is not restricted to the examples mentioned in this text, but it can be utilized in other solutions as well. It is clear that the invention can be modified for different applications in the scope of the inventive idea.

We claim:

1. A method comprising:
   forming plural load models, each load model corresponding to a different load of a construction, each load model corresponding to a single load;
   situating the load models into space where structural models representing structural members effect;
   defining an influence space for each load model, said influence space restricting a space in which the load corresponding to the load model affects;
   selecting for each load model at least one structural model corresponding to a structural member for carrying the corresponding load by using at least the influence space of the load model and locations of structural models as a criterion;
   storing each load model and selected structural models to be used in load decomposition calculations to obtain elementary loads for structural analysis; and
   using each stored load model and the selected structural models in load decomposition calculations to obtain elementary loads for structural analysis.

2. A method according to claim 1, wherein the load division calculations comprises:
   connecting each elementary load to the at least one structural model selected for the corresponding load model by at least one effect point of the elementary load, where an influence of the elementary load meets the at least one structural model; and
   calculating that each structural model is capable of carrying the elementary loads connected to it.

3. A method according to claim 2, wherein additional criteria is used to select structural models that are allowed to carry the load.

4. A method according to claim 3, wherein the defining the influence space further comprises defining at least one direction for an influence of a load.

5. A method according to claim 4, wherein the defining the influence space further comprises defining distances of the influence from an effect level of the load model.

6. A method according to claim 5, wherein the load model represents one of a following group comprising a point load, a line load, an area load, a dynamic load, a volume load, and a moment.

7. A method according to claim 3, wherein the additional criteria includes names of the structural models, the names being used for filtering the allowed structural models from the structural models.

8. A method according to claim 3, wherein the additional criteria includes types of the structural models, the types being used for filtering the allowed structural models from the structural models.

9. A method according to claim 1, wherein the criterion includes that a structural model is at least partly inside the influence space of the load model.

10. A method according to claim 9, wherein additional criteria is used to select structural models that are allowed to carry the load.

11. A method according to claim 10, wherein the defining the influence space further comprises defining at least one direction for an influence of a load.

12. A method according to claim 11, wherein the defining the influence space further comprises defining distances of the influence from an effect level of the load model.

13. A method according to claim 12, wherein the load model represents one of a following group comprising a point load, a line load, an area load, a dynamic load, a volume load, and a moment.

14. A method according to claim 10, wherein the additional criteria includes names of the structural models, the names being used for filtering the allowed structural models from the structural models.

15. A method according to claim 10, wherein the additional criteria includes types of the structural models, the types being used for filtering the allowed structural models from the structural models.

16. A method according to claim 9, wherein load division calculations comprises:
    connecting each elementary load to the at least one structural model selected for the corresponding load model by at least one effect point of the elementary load, where an influence of the elementary load meets the at least one structural model; and
    calculating that each structural model is capable of carrying the elementary loads connected to it.

17. A method according to claim 16, wherein additional criteria is used to select structural models that are allowed to carry the load.

18. A method according to claim 17, wherein the defining the influence space further comprises defining at least one direction for an influence of a load.

19. A method according to claim 18, wherein the defining the influence space further comprises defining distances of the influence from an effect level of the load model.

20. A method according to claim 19, wherein the load model represents one of a following group comprising a point load, a line load, an area load, a dynamic load, a volume load, and a moment.

21. A method according to claim 17, wherein the additional criteria includes names of the structural models, the names being used for filtering the allowed structural models from the structural models.

22. A method according to claim 17, wherein the additional criteria includes types of the structural models, the types being used for filtering the allowed structural models from the structural models.

23. A method according to claim 1, wherein the selecting is performed among relevant structural models deduced from the structure of the construction.

24. A computer being arranged to have access to a model of a construction, said model comprising structural models illustrating structural members of the construction, said computer comprising:
    a module for forming, to the model of the construction, models of loads corresponding to loads that the construction has to be able to carry;
    a storage element;
    a module for storing each model of the loads in the storage element;

a module for defining an influence space for each model of a load, the influence space restricting a space in which the load corresponding to the model of the load affects;

a module for selecting for each stored model of load at least one structural model from structural models locating within the influence space of the model of the load; and a module for decomposing each model of a load and selected structural models to obtain elementary loads for structural analysis.

25. A computer according to claim 24, wherein the module for selecting is configured to use additional requirements when selecting structural models, said additional requirements defining structural models that are allowed to carry the model of the load.

26. A computer according to claim 25, wherein the module for selecting is configured to use names of the structural models for filtering the allowed structural models from the structural models.

27. A computer according to claim 25, wherein the module for selecting is configured to use types of structural models for filtering the allowed structural models from the structural models.

28. A computer according to claim 24, wherein the module for defining the influence space is configured to define at least one direction for an influence of the corresponding model of the load.

29. A computer according to claim 28, wherein the module for defining the influence space is configured to define distances of an influence of the corresponding model of the load around an effect level of the model of the load.

30. A computer according to claim 29, wherein the model of the load represents one of the following group comprising a point load, a line load, an area load, a dynamic load, a volume load, and a moment.

31. A computer according to claim 24, wherein the module for defining the influence space is configured to define distances of an influence of the corresponding model of the load around an effect level of the corresponding model of the load.

32. A computer according to claim 31, wherein the model of the load represents one of the following group comprising a point load, a line load, an area load, a dynamic load, a volume load, and a moment.

33. A computer according to claim 24, further comprising a module for connecting each elementary load to the selected at least one structural model by at least one effect point of the elementary load, where influence of the elementary load meets the at least one structural model;

a module for calculating that each structural model is capable of carrying the elementary loads connected to it.

34. A computer program product embodied on a computer-readable medium and comprising code that, when executed, causes a computer to perform the following:

forming models of loads which correspond to the loads of the construction, each model of a load corresponding to a single load;

situating the models of loads into a space where structural models representing structural members effect;

defining an influence space for each model of a load, said influence space restricting a space in which the load corresponding to the model of the load affects;

selecting for each model of a load at least one structural model corresponding to a structural member for carrying the corresponding load by using at least the influence space of the model of the load and locations of structural models as a criterion; and using each model of a load and selected structural models in load decomposition calculations to obtain elementary loads for structural analysis.

35. A computer program product according to claim 34, wherein the execution of the code further causes a computer to perform the following:

connecting each elementary load to the at least one structural model selected for the corresponding model of the load by at least one effect point of the elementary load, where an influence of the elementary load meets the at least one structural model.

* * * * *